(12) United States Patent
Bhattacharyya

(10) Patent No.: US 8,415,715 B2
(45) Date of Patent: *Apr. 9, 2013

(54) DISCRETE TRAP NON-VOLATILE MULTI-FUNCTIONAL MEMORY DEVICE

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/415,408

(22) Filed: Mar. 8, 2012

(65) Prior Publication Data

US 2012/0161223 A1 Jun. 28, 2012

Related U.S. Application Data

(60) Continuation of application No. 12/857,026, filed on Aug. 16, 2010, now Pat. No. 8,143,657, which is a division of application No. 12/212,970, filed on Sep. 18, 2008, now Pat. No. 7,786,516, which is a division of application No. 11/202,288, filed on Aug. 11, 2005, now Pat. No. 7,436,018.

(51) Int. Cl.
*H01L 27/148* (2006.01)

(52) U.S. Cl. .................. 257/234; 257/E29.309

(58) Field of Classification Search ............. 257/234, 257/E29.309
See application file for complete search history.

(56) References Cited

U.S. PATENT DOCUMENTS

| | | | |
|---|---|---|---|
| 6,121,654 | A | 9/2000 | Likharev |
| 6,987,689 | B2 | 1/2006 | Bozano et al. |
| 7,436,018 | B2 * | 10/2008 | Bhattacharyya ............. 257/315 |
| 7,476,927 | B2 | 1/2009 | Bhattacharyya |
| 8,143,657 | B2 * | 3/2012 | Bhattacharyya ............. 257/298 |
| 2001/0013621 | A1 * | 8/2001 | Nakazato ............. 257/314 |
| 2003/0047755 | A1 | 3/2003 | Lee et al. |
| 2003/0151948 | A1 | 8/2003 | Bhattacharyya |
| 2003/0222306 | A1 * | 12/2003 | Hoefler et al. ............. 257/347 |
| 2004/0121544 | A1 | 6/2004 | Chang |
| 2005/0167734 | A1 | 8/2005 | She et al. |

OTHER PUBLICATIONS

W.D. Brown et al.; Nonvolatile Semiconductor Memory Technology; IEEE Press; 1998; p. 320-323 & p. 349-351.
X. Wang et al.; A Novel MONOS-Type Nonvolatile Memory Using High-κ Dielectrics for Improved Data Retention and Programming Speed; IEEE Transactions on Electron Devices; vol. 51, No. 4; Apr. 2004; p. 597-602.
J.H. Chen et al.; Non Volatile Flash Memory Device Using Ge Nano-Crystals Embedded in HfAlO High K Dielectric; NVM Workshop; 2005; p. 1124.
K.K. Likharev; Riding the Crest of a New Wave in Memory; Circuits and Devices; Jul. 2000; p. 16-21.

(Continued)

*Primary Examiner* — Matthew Reames
(74) *Attorney, Agent, or Firm* — Leffert Jay & Polglaze, P.A.

(57) ABSTRACT

A multiple layer tunnel insulator is fabricated between a substrate and a discrete trap layer. The properties of the multiple layers determines the volatility of the memory device. The composition of each layer and/or the quantity of layers is adjusted to fabricate either a DRAM device, a non-volatile memory device, or both simultaneously.

20 Claims, 9 Drawing Sheets

OTHER PUBLICATIONS

B. Govomeau et al.; A Figure of Merit for Flash Memory Multi-Layer Tunnel Dielectrics; Simulation of Semiconductor Processes and Devices; 2001; p. 270-273.

B. Govomeau et al.; VARIOT: A Novel Multilayer Tunnel Barrier Concept for Low-Voltage Nonvolatile Memory Devices; IEEE Electron Devices Letters; vol. 24; 2003; p. 99-101.

Jan Van Houdt; High-K Materials for Nonvolatile Memory Applications; IEEE 43rd International Reliability Symposium; 2005; p. 234-239.

Y. Zhang et al.; Flash Memroy Cell with $LaAlO_3$ ($\kappa$= 27.5) as Tunneling Dielectrics for beyond Sub-50 nm Technology; NVM Workshop; 2005.

Seki et al.; Electron Trapping levels in rf-sputtered $Ta_2O_5$ films; J Vac. Sci. Technology; 1983; p. 1825-1830.

X. Wang et al.; A Novel High-K SONOS Memory using $TaN/Al_2O_3/Ta_2O_5/HfO_2/Si$ Structure for Fast speed and Long Retention Operation beyond the 45nm Generation; NVMSW; 2005.

C.H. Lai et al.; Novel $SiO_2/AlN/HfAlO/IrO_2$ Memory with Fast Erase, Large $\Delta V_{th}$ and Good Retention; NVMW; 2005.

T. Watanabe et al.; Impact HF Concentration on Performance and Reliability for HfSiON-CMOSFET; IEDM; 2004; p. 507-510.

J.J. Lee et al.; Dielectric Engineering in Nanocrystal Memory Devices for Improved Programming Dynamics; IEEE 43rd Annual Reliability Physics Symposium; 2005; p. 668-669.

S. Yu et al.; 3D GOI CMOSFETs with Novel $IrO_2$(Hf) Dual Gates and High-$\kappa$ Dielectric on 1P6M-0.18 μm-CMOS; IEDM; 2004; p. 181-184.

\* cited by examiner

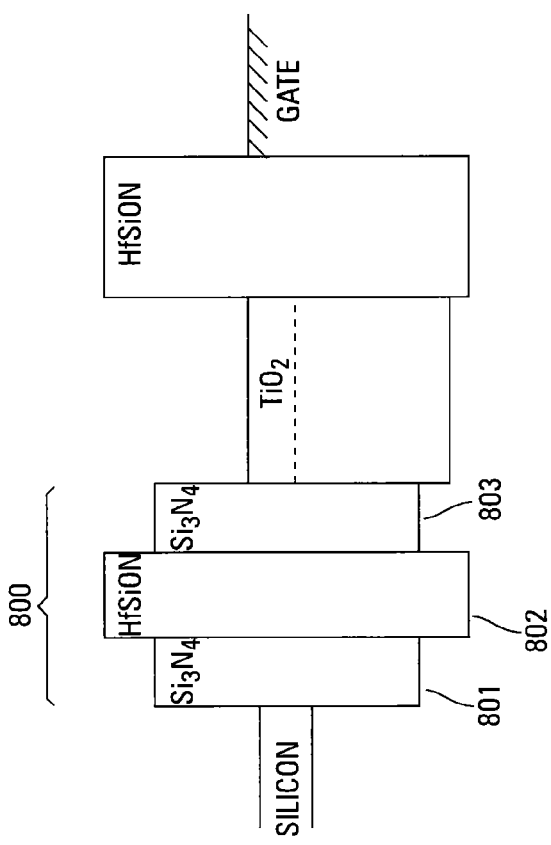
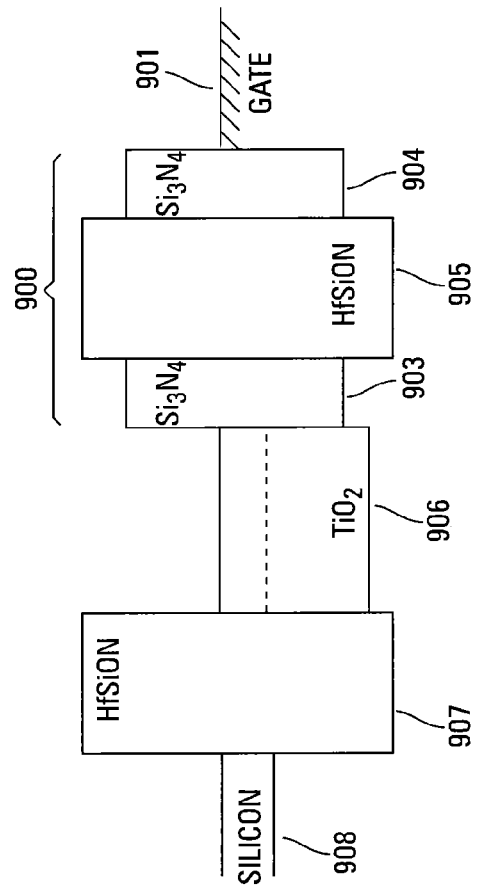
FIG. 8
FIG. 9

DISCRETE TRAP NON-VOLATILE MULTI-FUNCTIONAL MEMORY DEVICE

RELATED APPLICATIONS

This is a continuation of U.S. application Ser. No. 12/857,026, titled "DISCRETE TRAP NON-VOLATILE MULTI-FUNCTIONAL MEMORY DEVICE", filed Aug. 16, 2010 now U.S. Pat. No. 8,143,657, which is a divisional of U.S. application Ser. No. 12/212,970, titled "DISCRETE TRAP NON-VOLATILE MULTI-FUNCTIONAL MEMORY DEVICE", filed Sep. 18, 2008 now U.S. Pat. No. 7,786,516, which is a divisional of U.S. application Ser. No. 11/202,288, now U.S. Pat. No. 7,436,018, filed Aug. 11, 2005, all of which are commonly assigned and incorporated herein by reference.

TECHNICAL FIELD

The present invention relates generally to memory devices and in particular the present invention relates to DRAM and non-volatile memory devices.

BACKGROUND

Memory devices are typically provided as internal, semiconductor, integrated circuits in computers or other electronic devices. There are many different types of memory including random-access memory (RAM), read only memory (ROM), non-volatile, floating gate NOR/NAND flash memory, and dynamic random access memory (DRAM).

Flash memories may use floating gate technology or trapping technology. Floating gate cells include source and drain regions that are laterally spaced apart to form an intermediate channel region. The source and drain regions are formed in a common horizontal plane of a silicon substrate. The floating gate, typically made of doped polysilicon, is disposed over the channel region and is electrically isolated from the other cell elements by oxide. The non-volatile memory function for the floating gate technology is created by the absence or presence of charge stored on the isolated floating gate.

The trapping technology functions as a non-volatile memory and can be implemented in a silicon-oxide-nitride-oxide-silicon (SONOS) architecture. The nitride trap layer can capture and store electrons or holes in order to act as a non-volatile memory.

Conventional DRAM cells are comprised of a switching transistor and an integrated storage capacitor tied to the storage node of the transistor. Charge storage is enhanced by providing appropriate storage capacity in the form of a stacked capacitor or a trench capacitor in parallel with the depletion capacitance of the floating storage node. DRAM cells are volatile and therefore lose data when the power is removed.

DRAMs use one or more arrays of memory cells arranged in rows and columns. Each of the rows of memory cells is activated by a corresponding row line that is selected from a row address. A pair of complementary digit lines are provided for each column of the array and a sense amplifier coupled to the digit lines for each column is enabled responsive to a respective column address. The sense amplifier senses a small voltage differential between the digit lines and amplifies such voltage differential.

Due to finite charge leakage across the depletion layer, the capacitor has to be recharged frequently to ensure data integrity. This is referred to in the art as refreshing and can be accomplished by periodically coupling the memory cells in the row to one of the digit lines after enabling the sense amplifiers. The sense amplifiers then restore the voltage level on the memory cell capacitor to a voltage level corresponding to the stored data bit. The permissible time between refresh cycles without losing data depends on various factors, such as rate of charge dissipation in the memory capacitor, but is typically in the range of milliseconds.

Computers, cell phones, and many other hand-held electronic devices employ several types of the above memories for working memory and data store. These memories require custom technologies that are typically not compatible to each other due to different cell design, fabrication techniques, and material characteristics. Consequently, the different memories are produced on different silicon substrates to minimize cost and maximize product yield.

Both DRAM and floating gate flash consume relatively high power compared to other memory technologies. DRAM requires frequent refreshing to maintain the data integrity while flash memory requires on-chip high voltage/current for programming and erase operations.

Another problem with these technologies is scalability. The DRAM has capacitor scalability problems while the flash has voltage and coupling noise scalability problems. Additionally, with progressive scaling of feature size, fundamental device leakage issues such as short-channel effects and gate dielectric leakage will need to be contained in order to take advantage of scaling.

For the reasons stated above, and for other reasons stated below that will become apparent to those skilled in the art upon reading and understanding the present specification, there is a need in the art for a low power, scalable, multifunctional memory cell.

BRIEF DESCRIPTION OF THE DRAWINGS

FIG. 8 shows a band diagram of another alternate embodiment of the multiple layer tunnel barrier memory device of the present invention.

FIG. 9 shows a band diagram of the embodiment of FIG. 8 in a reverse mode of operation.

DETAILED DESCRIPTION

Figures 1, 2:
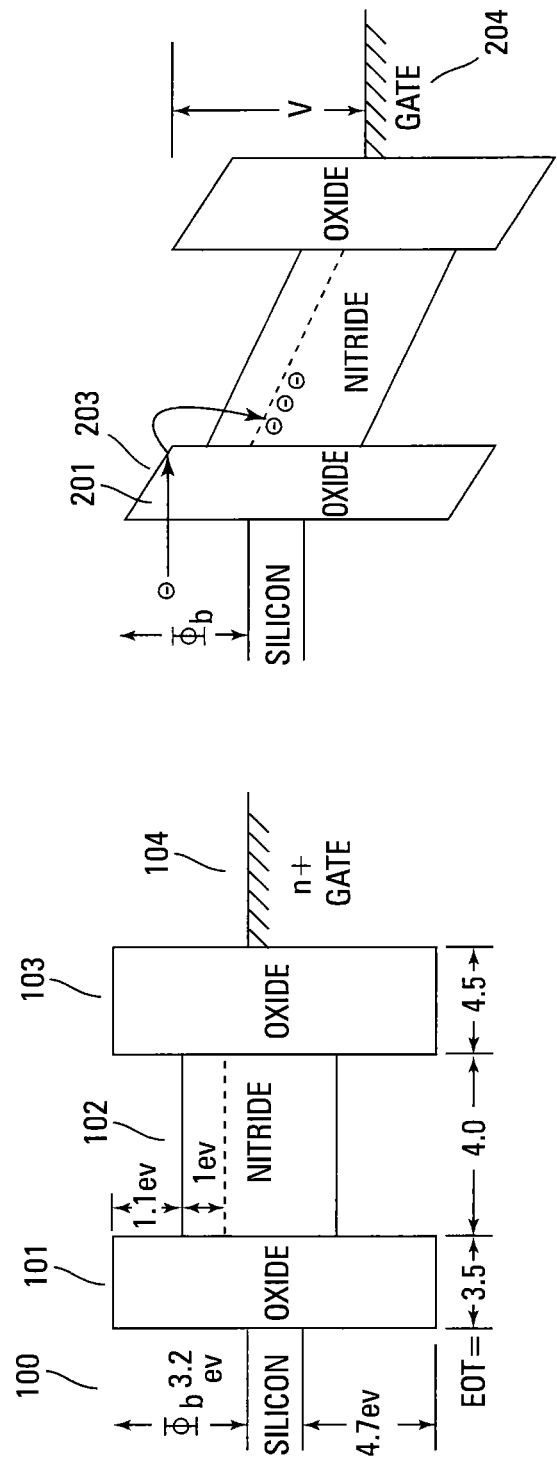
FIG. 1 shows an energy band diagram of a typical prior art SONOS structure.
FIG. 2 shows an energy band diagram of the SONOS structure of FIG. 1 under a bias condition.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions.

FIG. 1 illustrates an energy band diagram of typical prior art silicon-oxide-nitride-oxide layers of a SONOS structure at flatbands. Flatband conditions exist when no charge is present in the semiconductor so that the silicon energy band is flat. It is assumed that this occurs at zero gate bias (neglecting the work-function difference between the gate electrode and silicon).

The illustrated structure is comprised of the silicon substrate 100, the oxide-nitride-oxide 101, 102, 103 (ONO) layer, and the control gate 104. The illustrated structure has an effective oxide thickness (EOT) of 12 nm since the tunnel oxide has an EOT of 3.5 nm, the nitride trap 102 has an EOT of 4.0 nm (physical thickness approximately 7.5 nm), and the charge blocking oxide 103 has an EOT of 4.5 nm.

SONOS and nano-crystal types of non-volatile memory devices are typically referred to as discrete trap or embedded trap devices. The charge to be stored in the trap layer 102 tunnels through the tunnel insulator 101 and is confined there due to the charge blocking insulator layer 103. The tunneling may be accomplished by direct and Fowler-Nordheim tunneling during write operations while holes tunnel by direct tunneling during erase operations. The trap layer 102 may be nitride for SONOS or nano-crystals (silicon, germanium, or metal embedded oxides).

Stored charge retention and erase speed sensitivity can depend on the tunneling distance (i.e., tunnel insulator thickness). For example, an increase in oxide insulator thickness from an EOT of 1 nm to 3 nm would result in a charge retention increase of approximately five orders of magnitude but also reducing the erase speed by nearly the same amount. This is due to the fact that both the back-tunneling electron current as well as the forward hole current are dependent on tunneling distance that in turn depends on the insulator thickness, given the large band energy barriers ($E_b$) of oxide of 3.2 eV for electrons and 4.7 eV for holes (with reference to silicon), respectively. The tunnel oxide 101 has an $E_b$ of approximately 9 eV, the nitride layer 102 has an $E_b$ of approximately 5.1 eV, and the charge blocking oxide has an $E_b$ of approximately 9 eV.

The band diagram of FIG. 1 also shows that the Schottky barrier height ($\Phi_b$) is 3.2 eV. $\Phi_b$ is the tunneling barrier for electrical conduction across the interface and, therefore, is of importance to the successful operation of any semiconductor device. The magnitude of $\Phi_b$ reflects the mismatch in the energy position of the majority carrier band edge of the silicon substrate 100 and the oxide tunnel insulator 101.

FIG. 2 illustrates an energy band diagram of the embodiment of FIG. 1 that is under a bias condition of V on the gate 204. Under the applied bias, the silicon-oxide interface barrier height, $\Phi_b$, does not change but the tunneling distance is reduced as shown 203 for an oxide thickness of 3.5 nm (EOT=3.5 nm).

Figure 3:
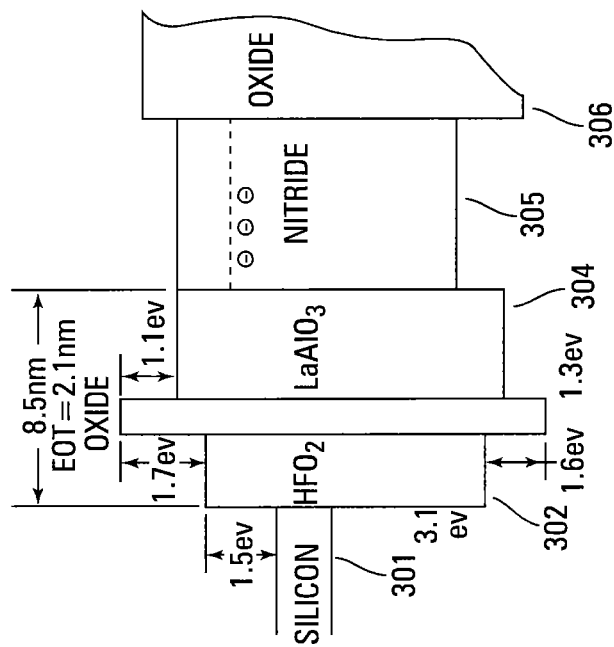
FIG. 3 shows a band diagram of one embodiment of the multiple layer tunnel barrier memory device of the present invention.

FIG. 3 illustrate an energy band diagram, at flatband, of one embodiment of the discrete trap, non-volatile device of the present invention. The illustrated embodiment replaces the tunnel oxide of the prior art with a set of layered dielectrics. The dielectric embodiments of the present invention effectively reduce the barrier energies of electrons and/or holes (i.e., the crested barrier) and the effective tunneling distance (i.e., barrier thinning) This provides many orders of magnitude enhancement of tunnel currents from silicon through the tunneling layers into deep traps while preventing back-tunneling of trapped charges to the silicon substrate due to asymmetry in both the barrier energy and tunnel distance. In other words, the carrier is allowed to easily tunnel to the trap layer but then requires substantially greater energy to return to the substrate.

The embodiment of FIG. 3 illustrates one set of layered dielectric as an $HfO_2$ 302 plus $SiO_2$ 303 plus $LaAlO_3$ 304. The figure additionally shows the silicon substrate 301, the nitride trap layer 305, and the oxide charge blocking layer 306.

In one embodiment, the $HfO_2$ has a physical thickness of approximately 2.5 nm with a dielectric constant (K) of 24 and an energy barrier of $E_b$=5.7 eV, the $SiO_2$ has a physical thickness of approximately 1 nm with a K=3.9 and an $E_b$=9.0 eV, and the $LaAlO_3$ has a physical thickness of approximately 5.0 nm with a K=27.5 and an $E_b$=6.6 eV. This set of layered dielectric replaces the 3.5 nm oxide 101 of FIG. 1 with a net EOT of 2.1 nm (total physical thickness=8.5 nm).

Figure 4:
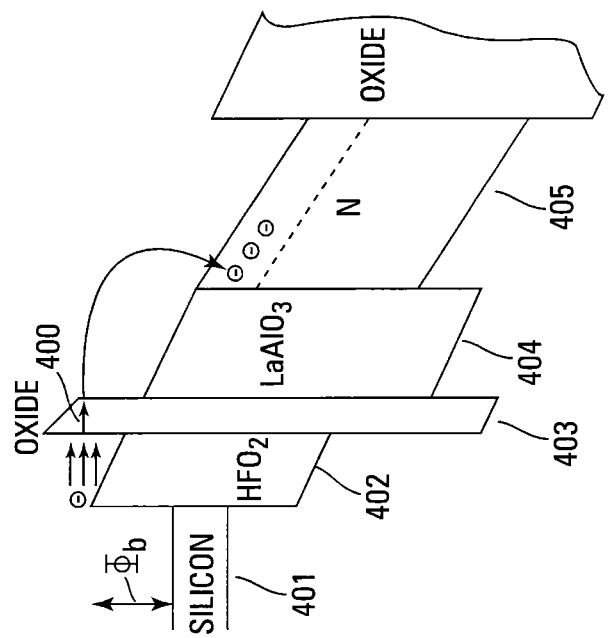
FIG. 4 shows a band diagram of the embodiment of FIG. 3 under a bias condition.

FIG. 4 illustrates an energy band diagram, at the bias condition V, of the layered dielectric embodiment of FIG. 3. Under this bias, the illustrated layered dielectric alters the transport characteristics such that the effective tunneling distance is significantly reduced when compared to the physical thickness. Additionally, while the effective tunneling distance for the electrons for the same voltage drop across the tunnel layers 402-404 has decreased and the effective barrier energy $E_b$ for the electrons to the conduction band is also reduced. As a result, electron currents are increased by several orders of magnitude from the silicon substrate 401 to the nitride trapping layer 405 under the equivalent bias when compared to the SONOS stack of FIG. 2.

Referring to FIGS. 3 and 4, it can be seen that the barrier height, $\Phi_b$, of the interface between the silicon 401 and the first layer (i.e., $HfO_2$) 402 of the tunneling dielectric is 1.5 eV. However, under the bias condition V, the effective barrier height to the conduction band is reduced and the effective tunneling distance, for the electrons for the same voltage across the tunnel layers, is decreased. In fact, once the electrons have reached the barrier energy required to tunnel through the oxide layer 400, they are above the energy necessary to traverse the LaAlO$_3$ layer 404 and, therefore, do not require any additional energy to reach the trap layer 405.

Therefore, even though the physical thickness has increased from the 3.5 nm of the prior art oxide embodiment of FIGS. 1 and 2 to 8.5 nm for the embodiment of FIGS. 3 and 4 of the present invention, the electron currents are increased by several orders of magnitude from silicon substrate to the nitride trapping layer under the same applied bias V. Since the physical thickness has increased, the trapped charges must tunnel a much larger distance for back tunneling. As a result, back tunneling current is greatly reduced. Thus the asymmetry in energy barrier and tunnel distance significantly enhances, by many orders of magnitude, electron transport speed and retention in the trapping layer.

Figure 5:
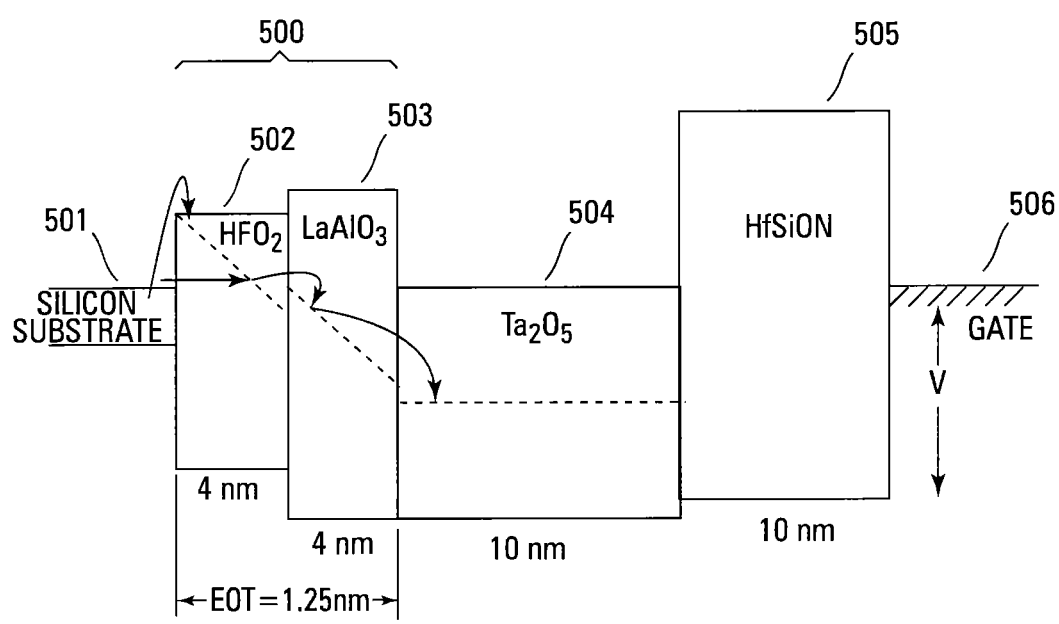
FIG. 5 shows a band diagram of another embodiment of the multiple layer tunnel barrier memory device of the present invention.

FIG. 5 illustrates a band diagram of another embodiment of the multiple layer tunnel dielectric of the present invention. This embodiment is a relatively simple two layer barrier device that demonstrates both barrier height (i.e., energy) reduction and barrier thinning (i.e., tunnel distance reduction) with a reverse tunneling distance of greater than 8 nm. FIG. 5 shows both the flatband diagram and the diagram under a bias V condition (dotted lines).

The embodiment is comprised of the two-layer tunnel dielectric 500, having an HfO$_2$ layer 502 (band gap 5.7 eV, $E_b$=5.7 eV) and an LaAlO$_3$ layer 503 (K=27.5, $E_b$=6.6 eV), formed over the silicon substrate 501. In the illustrated embodiment, the trapping layer 504 is comprised of approximately 10 nm of Ta$_2$O$_5$ (K=26) formed over the tunnel insulator 500 and an approximately 10 nm HfSiON (K=17, $E_b$=6.9 eV) charge blocking layer 505 formed over the trapping layer 504. The gate 506, polysilicon in one embodiment, is formed over the charge blocking layer 505.

The Ta$_2$O$_5$ trapping layer of FIG. 5 can also be replaced with alternative materials. These can include TiO$_2$ (K=80, $E_b$=3.5 eV) or AlN (K=10, $E_b$=5 3V). All of these materials in the embodiments of FIG. 5 have a deeper energy trap than nitride.

The HfSiON charge blocking layer 505 can be replaced with alternative materials in alternate embodiments. These materials can include SiON (K=5.0, $E_b$=7.2 eV), HfSiO$_4$, LaAlO$_3$ (K=15, $E_b$=6.0 eV), or Al2O3 (K=10, $E_b$=8.7 eV). These alternate materials may require thinner physical thicknesses to obtain substantially similar device characteristics. Still other embodiments may include a high work-function passivating metallic interface layer between the gate dielectric 505 the n+ polysilicon gate (e.g., TiN, TaN, IrO$_2$) to prevent electron injection from the gate 506.

The physical thicknesses of the HfO$_2$ layer 502 and the LaAlO$_3$ layer 503 are each approximately 4 nm with a net EOT=1.25 nm. The total EOT for the gate stack 500, 504, 505 is approximately 6 nm and the programming voltage level would be approximately +5V. The same device stack could be used for both a DRAM device and a PROM/NROM/flash memory device.

The dotted lines in HfO$_2$ and LaAlO$_3$ layers of the tunnel dielectric show that, under the V bias condition, the effective tunnel distance is reduced and is thinner than the physical thickness of HfO$_2$. Furthermore, the effective energy barrier is only that of HfO$_2$ of only 1.5 eV. Therefore, extremely high electron current to the trapping layer is achieved at low bias values of V. This characteristic is used to achieve DRAM programming speed.

For a DRAM application with the above described memory cell embodiment, the programming speed is on the order of approximately 10 ns while for the non-volatile device the programming speed is on the order of approximately 10 μs. DRAM refreshing time would be approximately greater than 10$^4$ seconds while the retention for a non-volatile device would be greater than ten years.

Figure 6:
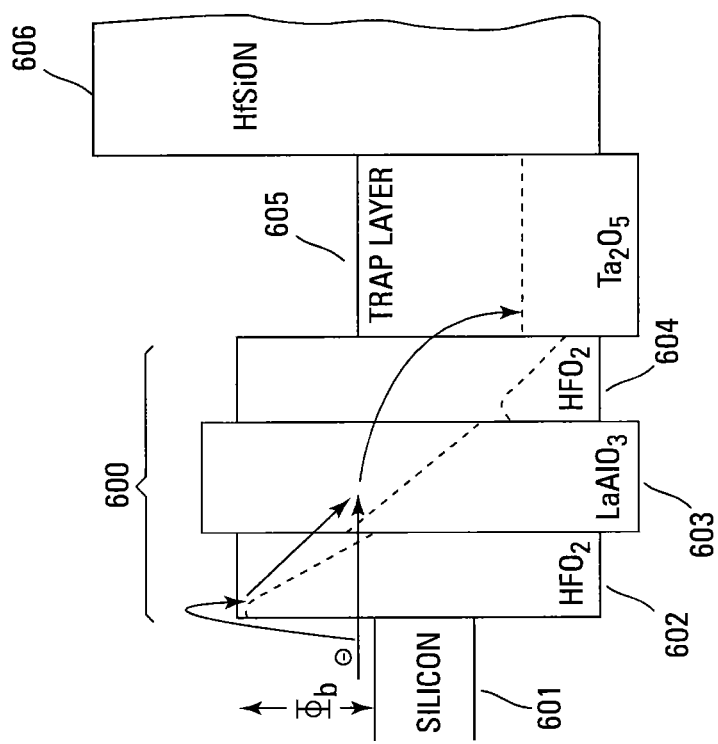
FIG. 6 shows a band diagram of another alternate embodiment of the multiple layer tunnel barrier memory device of the present invention.

FIG. 6 illustrates a band diagram of another alternate embodiment of the multiple layer tunnel barrier memory device of the present invention. This embodiment is comprised of a three layer tunnel barrier 600 device that uses approximately 3-4 nm of LaAlO$_3$ 603 sandwiched between two approximately 2 nm layers of HfO$_2$ 602, 604. In another alternate embodiment, the LaAlO$_3$ layer 603 of FIG. 6 is replaced by an equal thickness layer of HfSiON.

The trapping layer is approximately 10 nm of Ta$_2$O$_5$. The charge blocking layer 606 is HfSiON. Alternate embodiments may use other materials for any of these layers.

Figure 7:
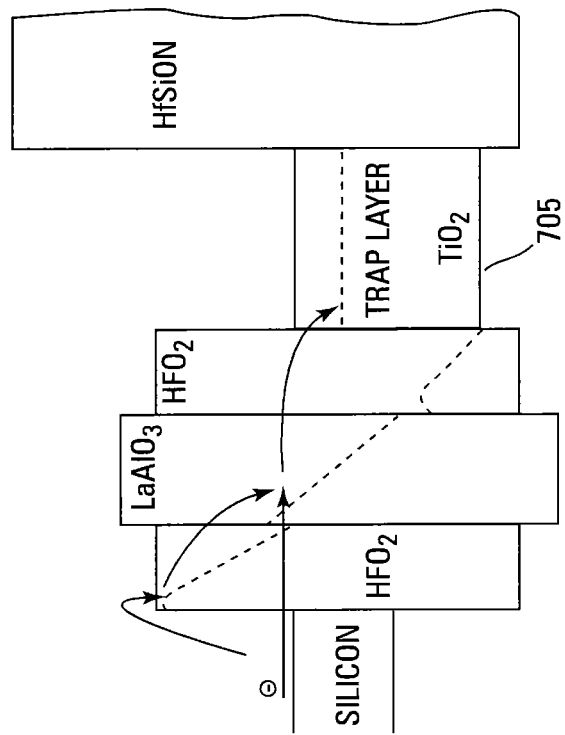
FIG. 7 shows a band diagram of another alternate embodiment of the multiple layer tunnel barrier memory device of the present invention.

FIG. 7 illustrates a band diagram of yet another embodiment of the present invention. This embodiment is substantially similar to that of FIG. 6 but replaces the trapping layer 705 with TiO$_2$. In one embodiment, this layer has a physical thickness of 10 nm.

In both embodiments of FIGS. 6 and 7, the barrier energy associated with the hole injection from silicon is higher and, therefore, hole current and associated erase speed is lower than when compared to the electron current and associated write speed.

FIG. 8 illustrates yet another embodiment of the multiple layer tunnel barrier memory device of the present invention. This embodiment uses a three layer tunnel barrier dielectric 800 based on the above-described concepts whereby the electron and hole injecting barriers could be reduced and be made close to each other such that both electron and hole currents and associated operation speed (i.e., write and erase) could be obtained close to each other. Tunnel layers 801-803 are comprised of approximately 2.5 nm of HfSiON 802 formed between approximately 1.5 nm each of silicon nitride or silicon oxynitride (SiON) (K=7, Eb approximately 5.5) with similar trapping and charge blocking layers as shown in above embodiments.

The programming voltage levels for such an embodiment may be somewhat higher (i.e., approximately 6 V) because of higher EOT of the gate insulator stack. However, programming and erase speeds would remain in substantially the same range.

The devices of FIGS. 5-8 could be further voltage scaled by appropriately selecting the material characteristics and the thickness of individual dielectric layers and also the final EOT of the gate insulator stack for such devices. Additionally, appropriate replacements using higher K dielectrics and laminates would provide voltage scalability. Therefore, many other combinations of tunneling layers, trapping layers, and charge blocking layers may be possible for both normal and reverse mode devices to enhance the device characteristics based on the above-described concepts. Additionally, charge trapping layers can be embedded with Ge and other high work-function nano-crystals to further improve the retention characteristics.

In the illustrated examples of FIGS. 3 through 8, the tunnel insulators comprised of single and multiple combinations of insulator layers such as HfO$_2$, SiO$_2$, LaAlO$_3$, SiN (or SiON), HfSiON, HfSiO, or LaO$_2$. Very thin films of all these insulators can be deposited over the silicon substrate with similar characteristics of very low trap density of much less than 10$^{11}$/cm$^2$, fixed charge much less than 10$^{11}$/cm$^2$ and very low interface state density with silicon of much less than 10$^{11}$/cm$^2$. These properties are essential for tunneling insulators and are also desired for charge blocking insulators, especially those of low trap density. These thin insulator films can be deposited by chemical vapor deposition (CVD), atomic layer deposition (ALD), and sputtering techniques. For charge blocking insulators, in addition to the above properties, insulators should have large energy barriers to prevent unwanted back injection of electrons and holes from the gate. In contrast, trapping insulators such as $TiO_2$, AlN, $Ta_2O_5$ have high trap density and are not usually suited for device insulator layers for tunneling or charge blocking.

FIG. 9 illustrates a band diagram of the embodiment of FIG. 8 in a reverse mode of operation. This embodiment can be used in both DRAM and non-volatile devices whereby the active charge injection takes place during programming from the gate electrode 901 to the $TiO_2$ trapping layer 906 instead of from the substrate 908 through the tunnel insulator 907.

In devices such as the embodiment of FIG. 9, the blocking layer 900 is formed as a relatively thinner layer (compared to the normal mode devices) and deposited over the silicon substrate and the multiple layer tunnel barrier is interfaced with the gated electrode. The tunnel layers 903-904 shown are multi-layer laminates of $Si_3N_4$ (nitride) or $HfO_2$ 903, 904 sandwiching a thin central layer 905 of HfSiON. This achieves both barrier energy reduction and barrier thinning.

In alternate embodiments, the multi-layer laminates could be comprised of atomic layers of $Si_3N_4$ and $HfO_2$ deposited by atomic layer deposition (ALD) techniques. Such devices would be nearly symmetric in speed both during erase and write operations. The three layer tunnel barrier device discussed with reference to FIG. 8 could also be made into a reverse polarity mode device with the tunnel layers interfacing the gate electrode to achieve substantially similar results. Such devices as above have the integration advantage with the fixed threshold logic field effect transistors (FETs) that are fabricated with either HfSiON or $LaAlO_3$ as gate insulators while the same insulator acts as the charge blocking layer for the memory device.

Figure 10:
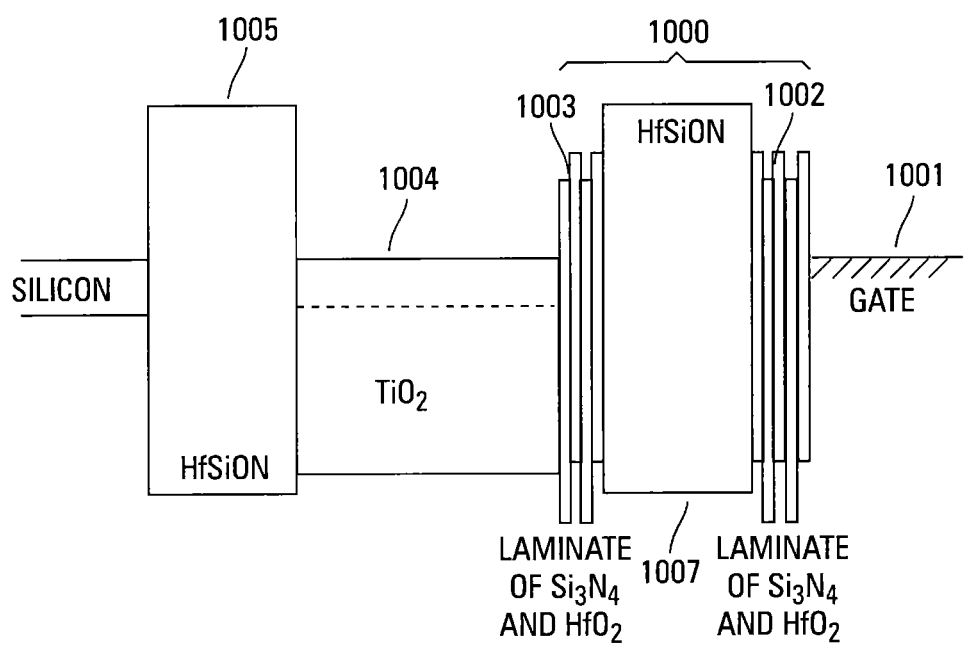
FIG. 10 shows a band diagram of a reverse polarity mode embodiment of the present invention.

FIG. 10 shows an embodiment that is substantially similar to the reverse mode embodiment of FIG. 9 in that the charge injection takes place during programming from the gate. This embodiment also uses a multi-layer laminate tunnel layer 1000, a charge trapping layer 1004 of $TiO_2$, and a charge blocking layer 1005 of HfSiON. In this embodiment, the central HfSiON tunnel layer 1007 of the tunnel layer 1000 is sandwiched by laminates 1002, 1003 that are each comprised of multiple very thin alternate layers of $Si_3N_4$ and $HfO_2$.

The above-described embodiments of the present invention modulate the tunnel current in order to change the volatility of the memory device. The asymmetric properties of the tunnel layer are adjusted by changing the materials of which the tunnel dielectric is comprised and/or the number of layers for the dielectric. This has the effect of making the energy required to move an electron from silicon to trapping layer (i.e., program operation) significantly lower than the energy required to move the electron in the reverse direction (i.e., back tunneling). Using such a fabrication technique allows the same technology to be used to make either a capacitor-less DRAM or a non-volatile memory device simply by engineering the tunnel layer properties to trade off programming speed (or tunnel current) with retention (volatility) of the device. Additionally, all illustrated device stacks operate during programming (write/erase) at an average stress field less than or equal to 2 mV/cm compared to SONOS devices where the programming stress field is greater than or equal to 10 mV/cm. Consequently, such devices as described above exhibit vastly improved endurance and reliability. This also permits these different devices to be fabricated on the same integrated circuit, as is illustrated in the memory system embodiment of FIG. 13.

Figure 11:
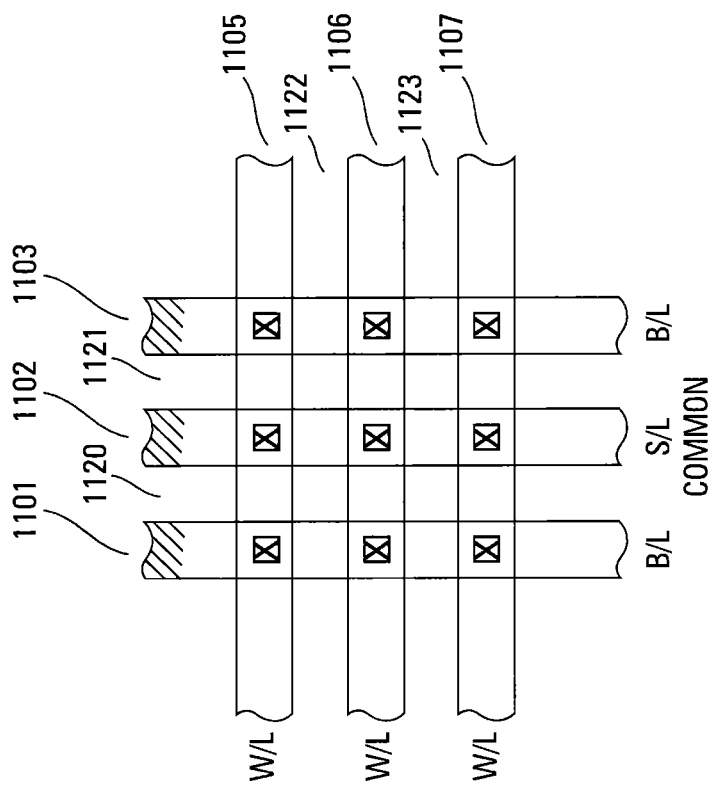
FIG. 11 shows a top view of one embodiment of a NOR array incorporating the memory devices of the present invention.

FIG. 11 illustrates a top view of a NOR memory array layout with self-aligned contacts in accordance with the memory cells of the present invention. This layout can be an array for a capacitor-less DRAM array, a NOR flash array, a NAND flash array, a NOR read only memory (NROM) array, or a programmable read only memory (PROM) array that incorporates the transistors of the present invention as illustrated previously.

The above-described transistors of the present invention, as incorporated into the array, can be vertical transistors, vertical surround gate transistors, or planar transistors. The present invention is not limited to any one transistor architecture.

The word lines 1105-1107 extend in the x-direction while the metal bit lines 1101-1103 extend substantially perpendicular in the y-direction. Isolation areas 1120, 1121 are formed between the bit lines 1101, 1102 and 1102, 1103 while isolation areas 1122, 1123 are formed between the word lines 1105, 1106. A common source line 1103 is formed in the memory array and is commonly coupled to the bit lines 1101, 1103 for devices on either side (left or right).

The flash memory arrays of the present invention can be fabricated in any architecture including NAND, NOR, or AND. Alternate embodiments can be fabricated in other architectures.

Figure 12:
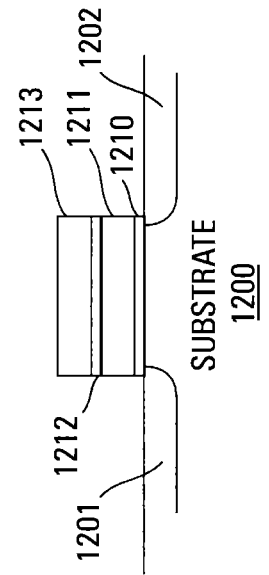
FIG. 12 shows a schematic cross-sectional view of one embodiment of a NOR multiple layer tunnel barrier memory cell of the present invention.

FIG. 12 illustrates a schematic cross-sectional view of one embodiment of the multiple layer tunnel barrier memory cell of the present invention. This embodiment is for purposes of illustration only as the above-described embodiments can be implemented in different architectures.

The embodiment of FIG. 12 is implemented as a planar memory cell FET in a silicon substrate 1200. Source/drain regions 1201, 1202 are implanted into the substrate. In one embodiment, the substrate is a p-type silicon and the source/drain regions 1201, 1202 are n+ implants. Alternate embodiments can use reverse conductivity.

The tunnel insulator 1210 of the present invention is formed over the substrate 1200 substantially between the active regions 1201, 1202. The charge trap layer 1211 is formed over the tunnel insulator 1210. The charge blocking layer 1212 is formed over the trap layer 1211. The gate electrode 1213 is formed over the charge blocking layer 1212.

Figure 13:
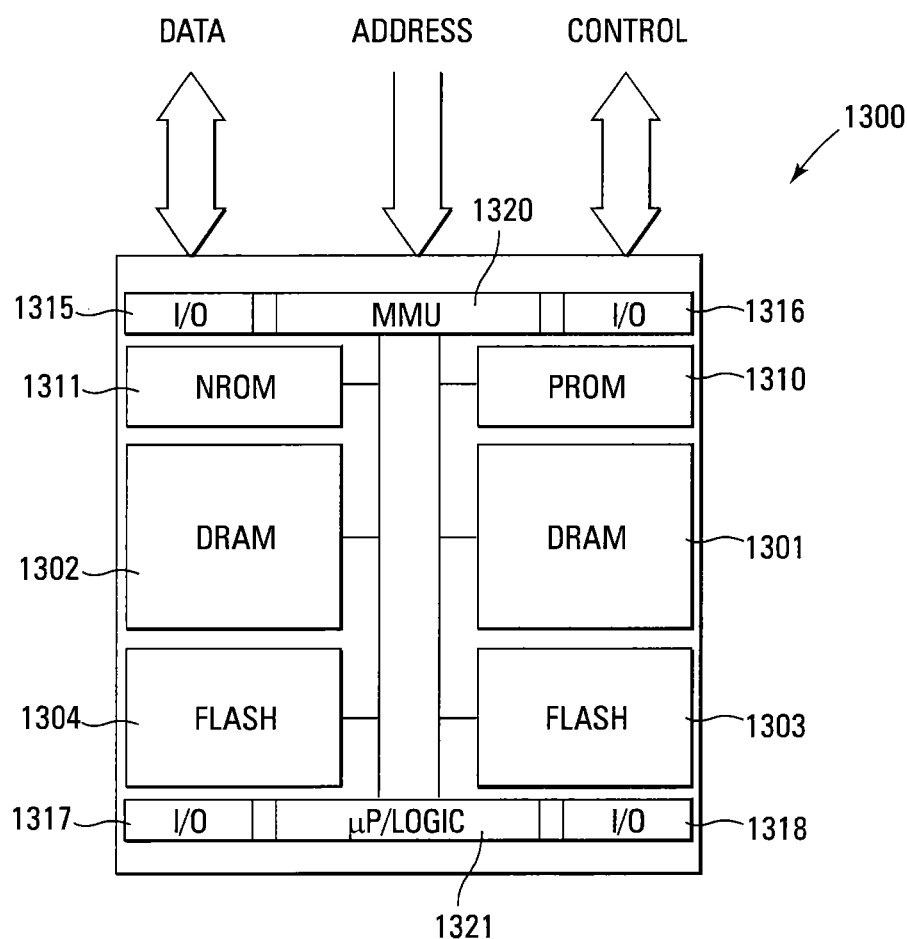
FIG. 13 shows a block diagram of one embodiment of a chip architecture of a memory subsystem of the present invention.

FIG. 13 illustrates a functional block diagram of a single chip controller/memory system device 1300 that can incorporate the non-volatile memory and DRAM cells of the present invention. The fabrication techniques of the above-described structures allow these different memory technologies to be fabricated on a single chip.

The embodiment of FIG. 13 is for purposes of illustration only. The NROM/PROM/flash/DRAM cells of the present invention can be incorporated in any integrated circuit.

The memory system 1300 is comprised of two capacitor-less DRAM arrays 1301, 1302, two flash memory arrays 1303, 1304, a PROM array 1310, and an NROM array 1311. Each of these memory arrays is constructed using the memory cells described previously.

The system can further contain various input/output (I/O) ports 1315-1318 that can be coupled to outside signals such as data, address, and control buses. A memory management unit (MMU) 1320 can be used to control access to each of the memory blocks 1301-1304, 1310, 1311 for both external access by another processor or by an internal microprocessor/control logic 1321.

Figure 14:
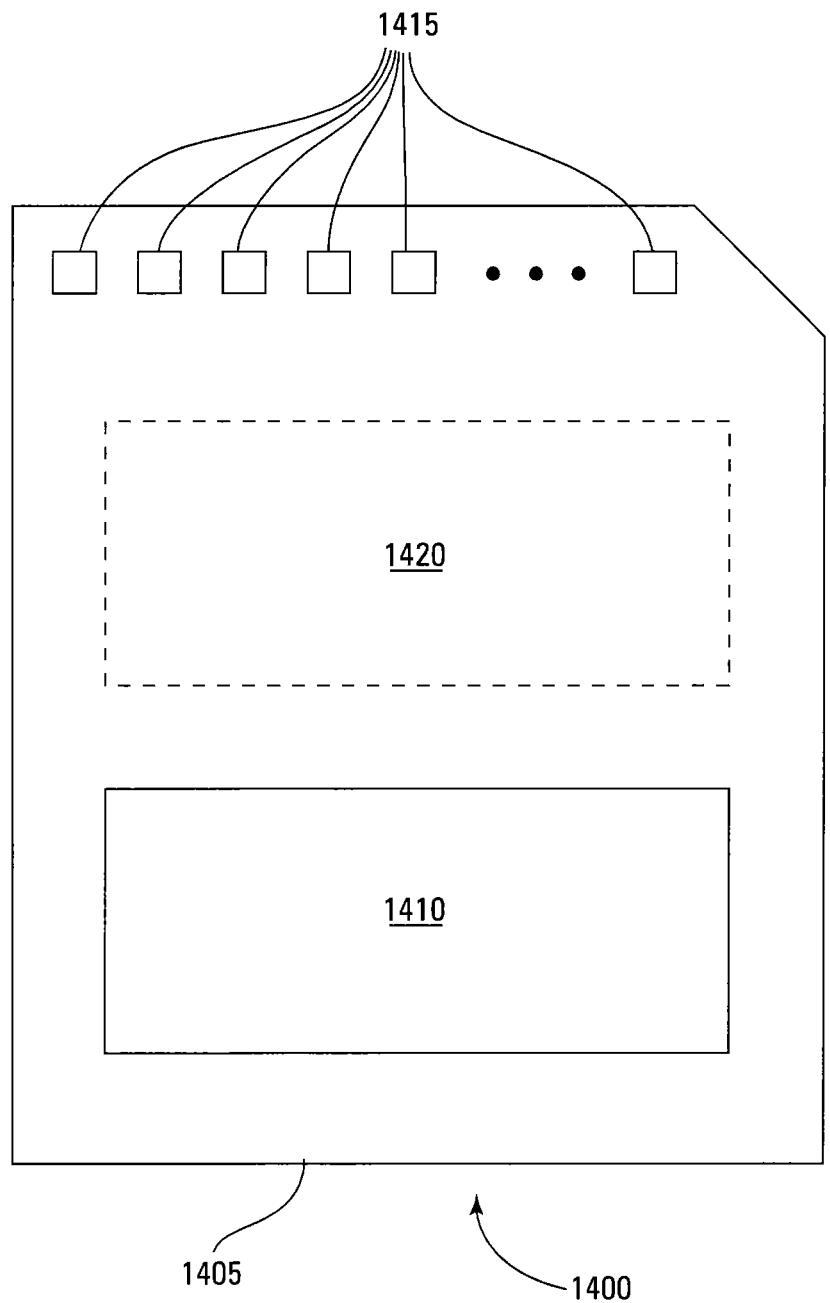
FIG. 14 shows a block diagram of one embodiment of a memory module incorporating the memory devices of the present invention.

FIG. 14 is an illustration of a memory module 1400 that incorporates the memory cell embodiments as discussed previously. Although memory module 1400 is illustrated as a memory card, the concepts discussed with reference to memory module 1400 are applicable to other types of removable or portable memory, e.g., USB flash drives. In addition, although one example form factor is depicted in FIG. 14, these concepts are applicable to other form factors as well.

Memory module 1400 includes a housing 1405 to enclose one or more memory devices 1410 of the present invention. The housing 1405 includes one or more contacts 1415 for communication with a host device. Examples of host devices include digital cameras, digital recording and playback devices, PDAs, personal computers, memory card readers, interface hubs and the like. For some embodiment, the contacts 1415 are in the form of a standardized interface. For example, with a USB flash drive, the contacts 1415 might be in the form of a USB Type-A male connector. For some embodiments, the contacts 1415 are in the form of a semi-proprietary interface, such as might be found on Compact-Flash™ memory cards licensed by SanDisk Corporation, Memory Stick™ memory cards licensed by Sony Corporation, SD Secure Digital™ memory cards licensed by Toshiba Corporation and the like. In general, however, contacts 1415 provide an interface for passing control, address and/or data signals between the memory module 1400 and a host having compatible receptors for the contacts 1415.

The memory module 1400 may optionally include additional circuitry 1420. For some embodiments, the additional circuitry 1420 may include a memory controller for controlling access across multiple memory devices 1410 and/or for providing a translation layer between an external host and a memory device 1410. For example, there may not be a one-to-one correspondence between the number of contacts 1415 and a number of I/O connections to the one or more memory devices 1410. Thus, a memory controller could selectively couple an I/O connection (not shown in FIG. 14) of a memory device 1410 to receive the appropriate signal at the appropriate I/O connection at the appropriate time or to provide the appropriate signal at the appropriate contact 1415 at the appropriate time. Similarly, the communication protocol between a host and the memory module 1400 may be different than what is required for access of a memory device 1410. A memory controller could then translate the command sequences received from a host into the appropriate command sequences to achieve the desired access to the memory device 1410. Such translation may further include changes in signal voltage levels in addition to command sequences.

The additional circuitry 1420 may further include functionality unrelated to control of a memory device 1410. The additional circuitry 1420 may include circuitry to restrict read or write access to the memory module 1400, such as password protection, biometrics or the like. The additional circuitry 1420 may include circuitry to indicate a status of the memory module 1400. For example, the additional circuitry 1420 may include functionality to determine whether power is being supplied to the memory module 1400 and whether the memory module 1400 is currently being accessed, and to display an indication of its status, such as a solid light while powered and a flashing light while being accessed. The additional circuitry 1420 may further include passive devices, such as decoupling capacitors to help regulate power requirements within the memory module 1400.

CONCLUSION

In summary, the tunnel dielectrics, gate insulator stack, and device features of the present invention achieve speed comparable to DRAM functionality with several orders of magnitude increased memory retention and with comparable endurance when compared to traditional DRAM at reduced power. The embodiments of the present invention also provide significantly enhanced speed and endurance for NROM and flash functionality with ten years of memory retention when compared to traditional NROM and flash memory devices, again at reduced power. Additionally, stack EOT reduction and three-dimensional implementation with contact-less array configurations could be employed to enhance density and scalability to reduce memory costs. Memory arrays exhibiting multiple functionality such as DRAM, flash, PROM, and others can be integrated in a single piece of silicon substrate with similar device and gate stack features.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory cell comprising:
   a semiconductor;
   a tunnel barrier adjacent to the semiconductor, wherein the tunnel barrier comprises:
     a first layer of HFO2;
     a second layer of HFSiON; and
     a third layer of HFO2;
   a charge trap structure adjacent to the tunnel barrier;
   a charge block structure adjacent to the charge trap structure; and
   a gate adjacent to the charge block structure.

2. The memory cell of claim 1, wherein the tunnel barrier is formed over the semiconductor.

3. The memory cell of claim 1, wherein the charge trap structure is formed over the tunnel barrier.

4. The memory cell of claim 1, wherein the charge block structure is formed over the charge trap structure.

5. The memory cell of claim 1, wherein the gate is formed over the charge block structure.

6. A memory cell comprising:
   a semiconductor;
   a tunnel barrier adjacent to the semiconductor, wherein the tunnel barrier comprises:
     a first layer of SiON;
     a second layer of HFSiON; and
     a third layer of SiON;
   a charge trap structure adjacent to the tunnel barrier;
   a charge block structure adjacent to the charge trap structure; and
   a gate adjacent to the charge block structure.

7. The memory cell of claim 6, wherein the charge trap structure is embedded with nanocrystals.

8. The memory cell of claim 6, wherein memory retention of the memory cell is responsive to properties of the tunnel barrier.

9. The memory cell of claim 6, wherein the memory cell is configured to operate with an average stress field of 2 mV/cm.

10. The memory cell of claim 6, wherein the charge trap structure comprises at least a layer of $TiO_2$.

11. The memory cell of claim 6, wherein the charge block structure comprises HfSiON.

12. The memory cell of claim 6, wherein a number of layers comprising the tunnel barrier are determined responsive to a desired energy necessary to move an electron from the semiconductor to the charge trap structure.

13. The memory cell of claim 12, wherein the desired energy is less than an energy necessary to move the electron from the charge trap structure to the semiconductor.

14. A memory cell comprising:
a silicon substrate;
a tunnel barrier formed adjacent to and on top of the silicon substrate, wherein the tunnel barrier comprises:
   a first layer of SiON formed on top of the silicon substrate;
   a layer of HFSiON formed on top of the first layer; and
   a second layer of SiON formed on top of the layer of HfSiON;
a charge trap structure formed adjacent to and on top of the tunnel barrier;
a charge block structure formed adjacent to and on top of the charge trap structure; and
a gate formed adjacent to and on top of the charge block structure.

15. The memory cell of claim 14, wherein the tunnel barrier is configured to reduce an effective tunneling distance from the substrate to the charge trap structure.

16. The memory cell of claim 14, wherein the charge trap structure is embedded with Ge nano-crystals.

17. The memory cell of claim 14, wherein the memory cell is configured to be a DRAM cell.

18. The memory cell of claim 14, wherein the silicon semiconductor, the charge trap structure, and the gate are configured to have substantially the same band energy.

19. The memory cell of claim 14, wherein the gate comprises a polysilicon.

20. The memory cell of claim 14, wherein the charge trap structure comprises a nitride.

* * * * *